US011482957B1

(12) United States Patent
Ives et al.

(10) Patent No.: US 11,482,957 B1
(45) Date of Patent: Oct. 25, 2022

(54) CASCADED MULTIPLE FEEDBACK CONTROLLER

(71) Applicant: Hamilton Sundstrand Corporation, Charlotte, NC (US)

(72) Inventors: Kyle Stephen Ives, Loves Park, IL (US); Michael C. Harke, DeForest, WI (US); Robert L. Seagren, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/391,123

(22) Filed: Aug. 2, 2021

(51) Int. Cl.
| | |
|---|---|
| H02P 9/10 | (2006.01) |
| B64F 5/60 | (2017.01) |
| H03K 5/24 | (2006.01) |
| H02M 7/06 | (2006.01) |
| B60L 1/00 | (2006.01) |
| B60L 3/00 | (2019.01) |
| H02G 3/00 | (2006.01) |

(52) U.S. Cl.
CPC .............. H02P 9/10 (2013.01); B64F 5/60 (2017.01); H02M 7/06 (2013.01); H03K 5/24 (2013.01)

(58) Field of Classification Search
CPC . Y02T 10/7005; Y02T 10/7077; B60R 16/03; B60R 16/0315; B60L 11/14

USPC ........................................................ 307/9.1
See application file for complete search history.

(56) References Cited

U.S. PATENT DOCUMENTS

| | | | |
|---|---|---|---|
| 7,852,646 B2 | 12/2010 | Rajne et al. | |
| 2020/0144928 A1* | 5/2020 | Schmitt | H02P 9/107 |
| 2021/0044231 A1 | 2/2021 | Harke et al. | |
| 2021/0249862 A1* | 8/2021 | Awal | H02J 3/01 |

FOREIGN PATENT DOCUMENTS

GB         2574028 A     11/2019

* cited by examiner

*Primary Examiner* — Quan Tra
(74) *Attorney, Agent, or Firm* — Cantor Colburn LLP

(57) ABSTRACT

Systems for a cascaded multiple feedback generator controller are provided. Aspects include a direct current (DC) power supply comprising a generator and a rectifier circuit connected to a load, a first voltage sensing device coupled to a first point of regulation, a second voltage sensing device coupled to a second point of regulation, a generator controller configured to receive a first voltage signal from the first voltage sensing device, receive a second voltage signal from the second voltage sensing device, determine an adjustment for the generator, the adjustment comprising a transient performance response and a voltage droop response, wherein the transient performance response is determined based on the first voltage signal, and wherein the voltage droop response is determined based on the second voltage signal, and operate the generator based on the adjustment for the generator.

20 Claims, 4 Drawing Sheets

CASCADED MULTIPLE FEEDBACK CONTROLLER

BACKGROUND

The present invention generally relates to electrical power generation systems, and more specifically, to cascaded multiple feedback controllers in electrical power generation systems.

Aircraft require electrical power to operate many parts of the aircraft system, including on-board flight control systems, lighting, air conditioning etc. The current and future generations of aircraft use more and more electrical control in place of conventional hydraulic, pneumatic etc. control. Such more electric aircraft (MEA) have advantages in terms of the size and weight of the controls and power systems as well as in terms of maintenance and reliability.

Most current large commercial aircraft use electricity, on-board, in the form of an AC fixed frequency and/or variable frequency network. Steps have been made to move from 115 V ac to 230 V ac and more recent developments have allowed power supplies to supply high voltage dc (HVDC) e.g. 270 V dc and higher, providing improvements in terms of additional functionality, power supply simplification, weight savings and thus fuel efficiency.

Generally, voltage is provided on board an aircraft in one of two (or more) ways. When the aircraft is on the ground, power comes from an external ground generator supplying, say 115 V ac at 400 Hz. When the aircraft is in the air the power comes from a multi-phase ac generator which is mounted on the aircraft engine or auxiliary power unit (APU) that could then be rectified. The produced AC voltage is then rectified using passive or active rectification techniques. The rectified power is provided to a so-called DC bus.

BRIEF DESCRIPTION

Embodiments of the present invention are directed to a system. A non-limiting example of the system includes a direct current (DC) power supply comprising a generator and a rectifier circuit connected to a load, a first voltage sensing device coupled to a first point of regulation, a second voltage sensing device coupled to a second point of regulation, a generator controller configured to receive a first voltage signal from the first voltage sensing device, receive a second voltage signal from the second voltage sensing device, determine an adjustment for the generator, the adjustment comprising a transient performance response and a voltage droop response, wherein the transient performance response is determined based on the first voltage signal, and wherein the voltage droop response is determined based on the second voltage signal, and operate the generator based on the adjustment for the generator.

Additionally or alternatively, in this or other embodiments, the system is determining the voltage droop response comprises comparing the second voltage signal to a reference voltage to determine a voltage droop on the load.

Additionally or alternatively, in this or other embodiments, the system is determining the voltage droop response comprises comparing the second voltage signal to the first voltage signal to determine a voltage droop on the load.

Additionally or alternatively, in this or other embodiments, the system is the first point of regulation is located at an output of the rectifier.

Additionally or alternatively, in this or other embodiments, the system is the second point of regulation is located at an input to the load.

Additionally or alternatively, in this or other embodiments, the system also includes a generator line contactor coupled between the rectifier circuit and the second voltage sensing device.

Additionally or alternatively, in this or other embodiments, the system also includes the controller that is further configured to compare the second voltage signal to a reference voltage to determine a voltage difference, compare the voltage difference to a threshold voltage difference, and enact an action based on the voltage difference exceeding the threshold voltage difference.

Additionally or alternatively, in this or other embodiments, the system is the action comprises generating an alert.

Additionally or alternatively, in this or other embodiments, the system is the action comprises opening the generator line contactor.

Additionally or alternatively, in this or other embodiments, the system also includes a state and saturation filter, wherein the state and saturation filter limits the bandwidth of the second voltage signal.

Additionally or alternatively, in this or other embodiments, the system also includes a prognosis and health monitoring (PHM) system for an aircraft.

Embodiments of the present invention are directed to a system. A non-limiting example of the system includes an alternating current (AC) power supply comprising a generator, wherein the generator is connected to a load, a first voltage sensing device coupled to a first point of regulation, a second voltage sensing device coupled to a second point of regulation, a generator controller configured to receive a first voltage signal from the first voltage sensing device, receive a second voltage signal from the second voltage sensing device, determine an adjustment for the generator, the adjustment comprising a transient performance response and a voltage droop response, wherein the transient performance response is determined based on the first voltage signal, and wherein the voltage droop response is determined based on the second voltage signal, and operate the generator based on the adjustment for the generator.

Additionally or alternatively, in this or other embodiments, the system is determining the voltage droop response comprises comparing the second voltage signal to a reference voltage to determine a voltage droop on the load.

Additionally or alternatively, in this or other embodiments, the system is determining the voltage droop response comprises comparing the second voltage signal to the first voltage signal to determine a voltage droop on the load.

Additionally or alternatively, in this or other embodiments, the system is the first point of regulation is located at an output of the generator.

Additionally or alternatively, in this or other embodiments, the system is the second point of regulation is located at an input to the load.

Additionally or alternatively, in this or other embodiments, the system also includes the controller that is further configured to compare the second voltage signal to a reference voltage to determine a voltage difference, compare the voltage difference to a threshold voltage difference, and enact an action based on the voltage difference exceeding the threshold voltage difference.

Additionally or alternatively, in this or other embodiments, the system is the action comprises generating an alert.

Additionally or alternatively, in this or other embodiments, the system is the action comprises opening the generator line contactor.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of aircraft electric power systems to implement the various technical features described herein are well known. Accordingly, in the interest of brevity, many conventional implementation details are only mentioned briefly herein or are omitted entirely without providing the well-known system and/or process details.

Figure 1:
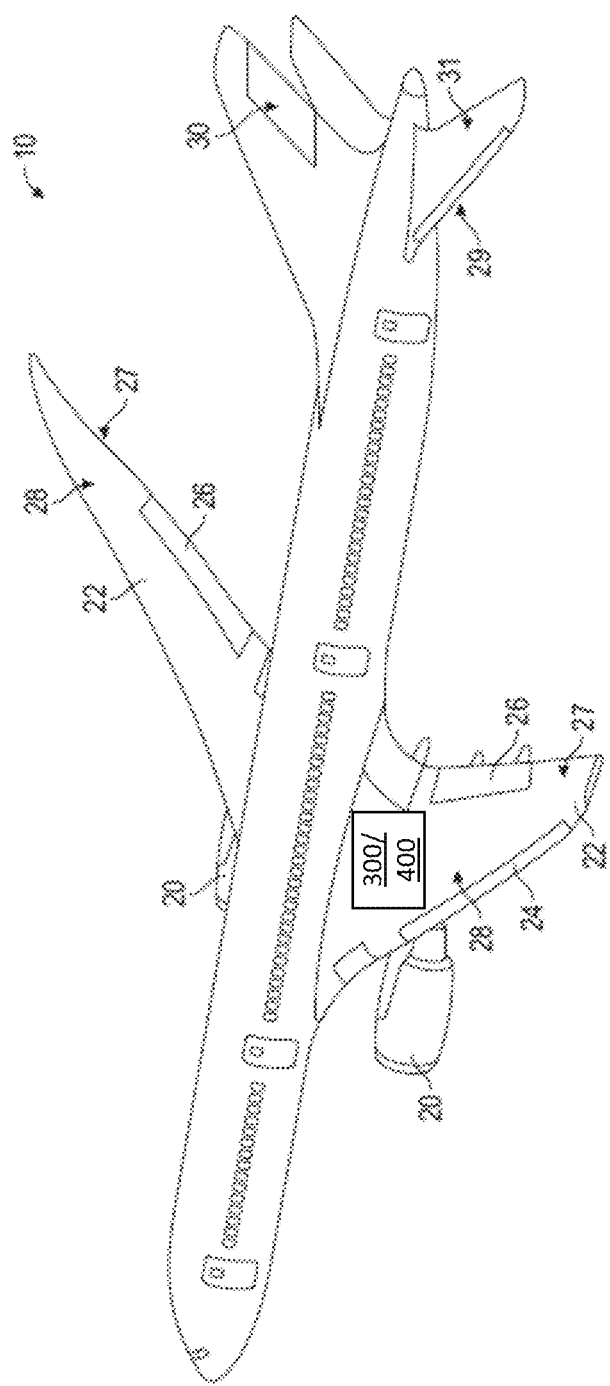
FIG. 1 is a perspective view of an aircraft that may incorporate embodiments of the present disclosure.

FIG. 1 illustrates an example of a commercial aircraft 10 having aircraft engines 20 that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. It will be understood that the slats 24 and/or the flaps 26 can include one or more slat/flap panels that move together. The aircraft 10 also includes a electric power generation systems (EPGS) 300/400 (described in greater detail in FIGS. 3 and 4) which allows for cascaded multiple feedback for generator control according to one or more embodiments. The EPGS can supply power to a DC and/or AC bus that provides power for a variety of power applications on the aircraft. The aircraft 10 is exemplary and is not intended to limit any application of the EPGS 300/400. The EPGS 300/400 can be utilized in a variety of applications including, but not limited to, rotorcrafts.

Turning now to an overview of technologies that are more specifically relevant to aspects of the disclosure, when the aircraft is in the air the power comes from an electric power generating system (EPGS) which typically includes one or more generators. The one or more generators receive mechanical power from an engine attached to an engine accessory gearbox. A generator controller for a wound-field synchronous generator is typical for aircraft power generation. In addition to other functions, the generator controller regulates generator voltage output by detecting the output voltage at a point of regulation (POR) and adjust the generator output voltage by controlling the current used to excite the main field in the generator. In a traditional system, the POR is determined by a directly by the GCU via a wired analog connection to the sensing point. In the concept EPGS, the POR voltage sensing can be performed by an external sensor independent from the GCU. This external sensor may have its own sensing tolerances and sensing latencies that need to be considered in the GCU voltage regulation control loop. The data from these external sensors could be analog voltages or a digital signal provided over a communication bus. These sensing tolerances and latencies can impact signal processing which may induce some latencies in the information received by the generator controller control loop. This type of implementation can result in reduced system voltage margin to requirements and reduced transient performance due to any additional delays and signal processing.

Figure 2:
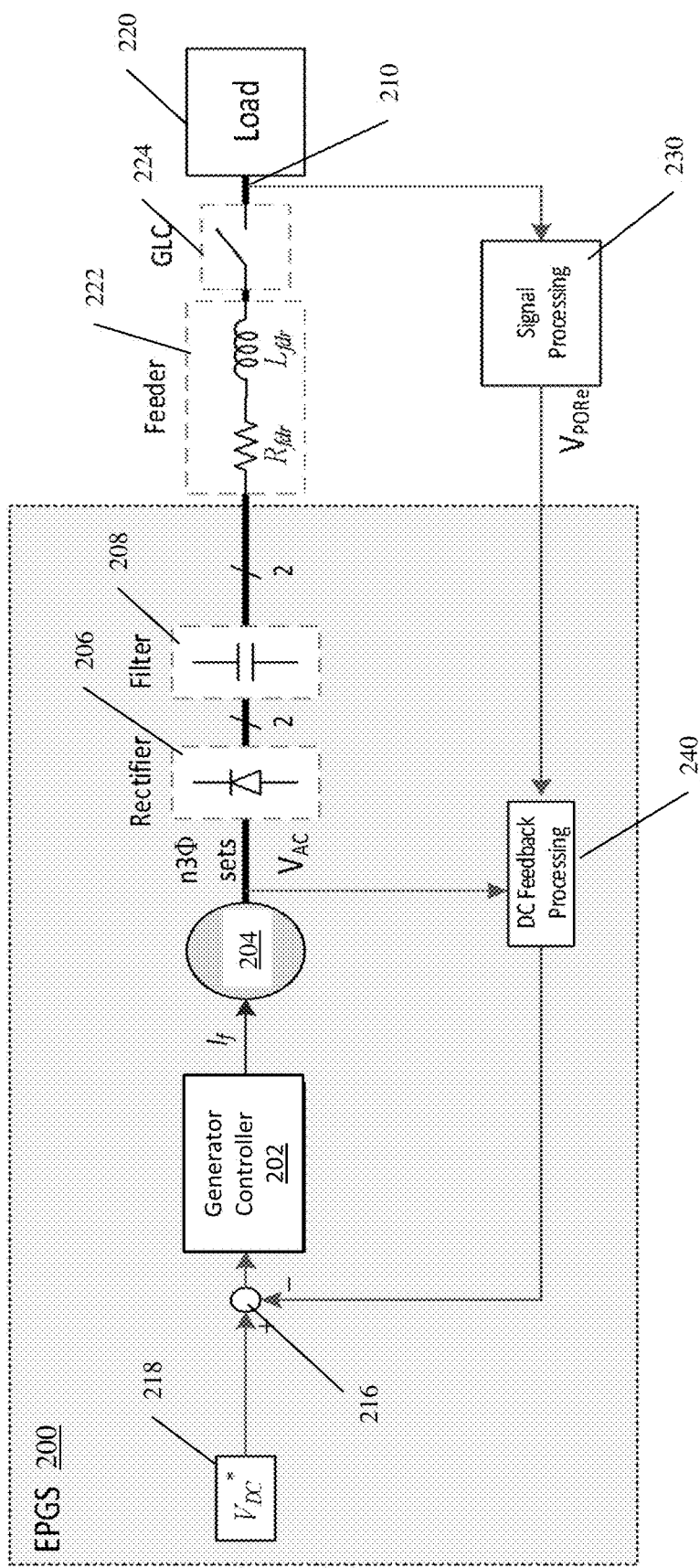
FIG. 2 depicts a direct current electrical power generation system (EPGS) with an external DC point of regulation according to one or more embodiments.

FIG. 2 depicts a direct current electrical power generation system (EPGS) with an external DC point of regulation according to one or more embodiments. The EPGS 200 includes a generator controller 202, a generator 204, a rectifier 206, and a filter circuit 208. The EPGS 200 includes DC feedback processing 240 which supplies a feedback signal to a comparator 216 which compares the feedback signal to a DC reference voltage 218 for input to the generator controller 202. The EPGS 200 connects to a DC load 220 through a feeder 222 and generator line contactor (GLC) 224. The feeder 222 is a generic representation of impedance on the wires connecting the EPGS 200 to the DC load 220. The EPGS 200 can receive a sensed voltage feedback signal from a point of regulation (POR) 210 which is taken at the connection to the DC load 220. The sensed voltage feedback signal from the POR 210 can be processed using signal processing 230 logic and hardware to provide an external point of regulation voltage (VPORe) to the DC feedback processing 240 logic and hardware. The signal processing 230 can be external to the EPGS 200 and designed by an airframe design team that is not in coordination with the EPGS 200 design team. In this scenario, the signal processing 230 may be too degraded for high performance and may not meet transient performance requirements. Aircraft electrical systems typically have power quality requirements that ensure compatibility between the aircraft electrical generation sources and the various aircraft user equipment which consumes electrical power, such as motors, pumps, galley equipment, etc. MIL-STD-704F is an example for military systems, and DO-160G Sec 16 is a typical example for commercial systems. Among other things, the power quality requirements determine how tightly the generating sources must regulate power during steady state operation, or in the case of load transients (large applications or removals of electrical load) how far and for how long the voltage can deviate from normal steady state values. If the Point of Regulation voltage sense used for dc or ac voltage control has heavy signal processing, this could lead to latencies in the signal which would negatively impact the controllers ability to meet the time sensitive transient performance requirements for voltage regulation/power quality. This design requires coordination across the design of the aircraft as the signal processing 230 logic and hardware is customer specific for an aircraft and can add latency to the feedback signal from the POR.

In one or more embodiments, aspects described herein address the transient performance requirements by providing a cascaded multiple feedback controller for an electric power generation system (EPGS). This EPGS utilizes multiple feedback signals to ensure adequate generator response with minimal signal processing in a cascaded topology. A higher bandwidth inner feedback loop is tuned for desired transient performance and a lower bandwidth outer loop is used to compensate for any voltage droop. In addition, monitoring of feeder voltage droop can provide for prognostics and health monitoring (PHM) of components between the feedback signals.

Figure 3:
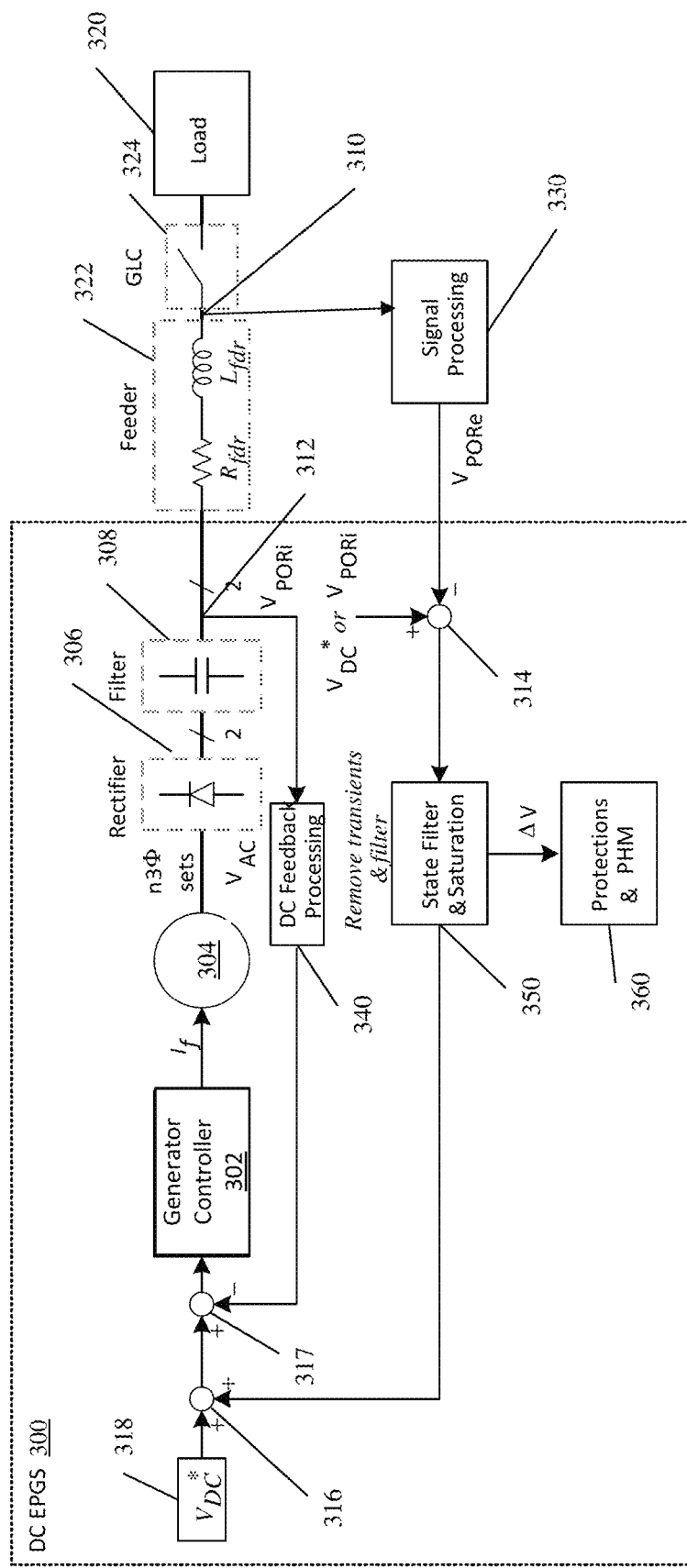
FIG. 3 depicts a DC EPGS using a cascaded multiple feedback controller according to one or more embodiments.

FIG. 3 depicts a DC EPGS using a cascaded multiple feedback controller according to one or more embodiments. The EPGS 300 includes a generator controller 302 in communication with a generator 304 that supplies an AC voltage through a rectifier 306 and filter 308 to produce a rectified DC voltage to a bus. The EPGS 300 connects to a DC load 320 through a feeder 322 and generator line contactor (GLC) 324. In one or more embodiments, the EPGS 300 utilizes two feedback signals from two points of regulation (POR). The first point of regulation (POR) 310 is at the connection to the GLC 324. The second POR 312 is at the connection between the filter 308 and the feeder 322. Similar to the above, the feeder 322 is a generic representation of impedance on the wires connecting the EPGS 300 to the DC load 320. The voltage sensed at the first POR 310 is external to the EPGS 300 and thus can have external signal processing 330 on the voltage prior to be fed back to the EPGS 300. This voltage can be referred to as the external POR voltage (VPORe). As mentioned above, the signal processing 330 can be customer specific and may not meet the requirements for high performance due to latency and other considerations. The voltage sensed at the second POR 312 is internal to the EPGS 300 and can be referred to as the internal POR voltage (VPORi). The external POR voltage can be fed back into the EPGS 300 where it is compared at comparator 314 with either a reference voltage (VDC) or the internal POR voltage (VPORi). The difference in the voltage (voltage droop) between the external POR voltage and the reference voltage or internal POR voltage is then fed through the state filter and saturation 350 logic and hardware. The state filter and saturation 350 logic and hardware can saturate the difference (delta) voltage by setting a limit on the voltage supplied to the second comparator 316. This limit on the voltage can account for events such as a short circuit so that the comparator 316 does not bias the voltage too high. The second comparator biases the voltage based on the voltage droop (delta V) to account for voltage droop from the external POR voltage. Once biased, the voltage signal is fed into a third comparator 317 which receives an inner loop voltage taken from the internal POR 312 and fed through the DC feedback processing 340 logic and hardware. This comparator 317 provides the feedback voltage to the generator controller 302 to regulate the generator 304. The generator controller 302 adjusts excitation current to control voltage, based on the combined inner and outer loop control mechanisms. Generally the outer detecting loop is ensuring accuracy of the POR steady state voltage level at the load, while the inner loop is higher bandwidth along for faster transient voltage response during large changes in the load. The bandwidth of the outer loop may be slower than the inner loop (based on the tuning of the filtering). This allows the voltage regulator to respond to the transients of the inner feedback loop with the outer loop compensating for any overall bias/droop out to the external POR 310 The state filter and saturation 350 logic and hardware also sets (limits) the bandwidth for this outer loop feedback so that it is slower than the inner loop feedback. In addition, the voltage droop (delta V) can be sent to a protection health monitoring system 360 that can be utilized to collect data on the overall system. Generally, in aircraft, PHM serves to predict wear and notify aircraft maintenance personnel of impeding component failure to allow for maintenance to be scheduled in advance and reduce unscheduled maintenance costs for aircraft. In one or more embodiments, the generator controller can enact an action based on the voltage droop exceeding a threshold. This action can be to open the GLC 324 to separate the EPGS 300 from the load 320.

In one or more embodiments, the internal point of regulation 312 and the external point of regulation 310 voltages can be sensed by any voltage sensing device. In addition, the current at these PORs 310, 312 can be sensed by any current sensing device. The sampling rate of the voltages and/or currents can be set by the generator controller 302 or by any other means.

Figure 4:
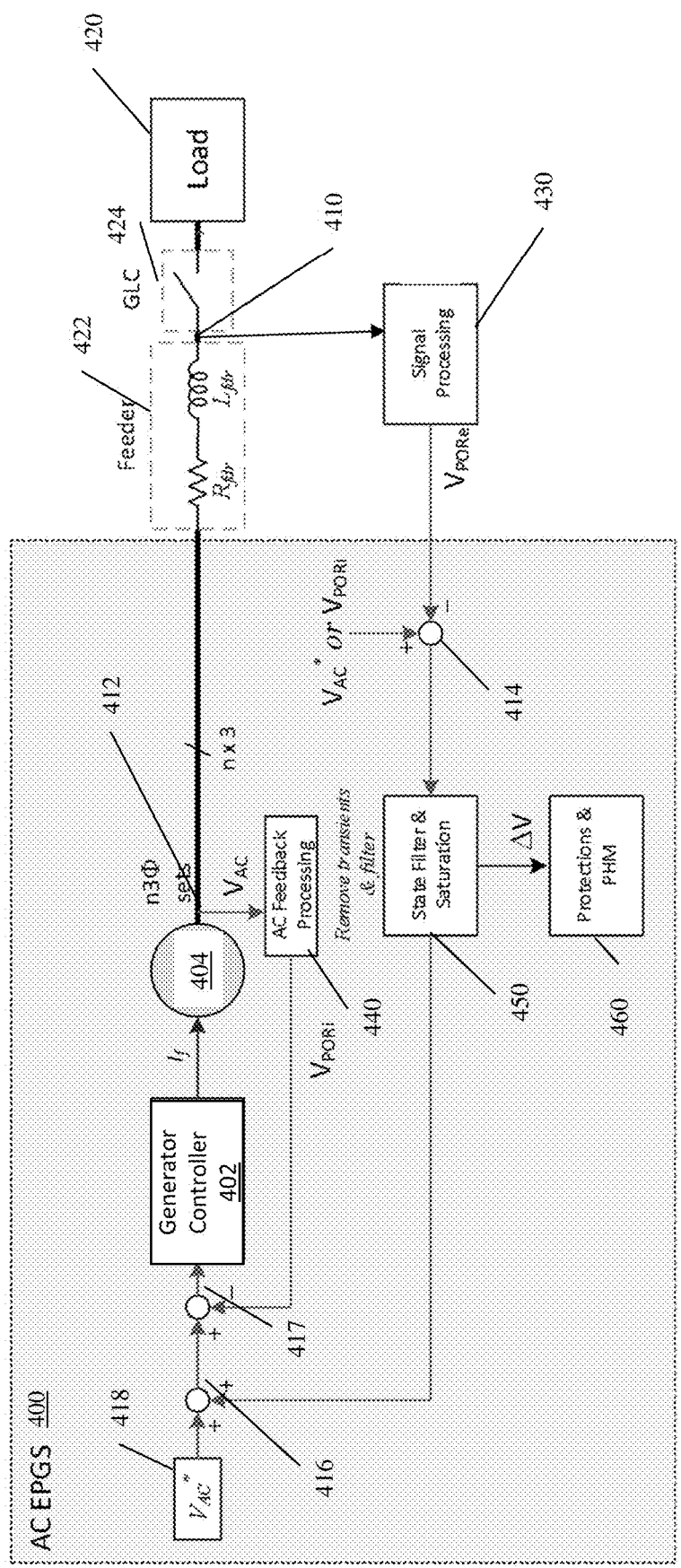
FIG. 4 depicts an AC EPGS using a cascaded multiple feedback controller according to one or more embodiments.

FIG. 4 depicts an AC EPGS using a cascaded multiple feedback controller according to one or more embodiments. The EPGS 400 includes a generator controller 402 in communication with a generator 404 that supplies an AC voltage to an AC load 420 through a feeder 422 and GLC 424. Similar to the EPGS 300 from FIG. 3, the EPGS 400 utilizes two feedback signals from two points of regulation (POR). The first point of regulation (POR) 410 is at the connection to the GLC 424. The second POR 412 is at the connection between the generator 404 and the feeder 422. Similar to the above, the feeder 422 is a generic representation of impedance on the wires connecting the EPGS 400 to the AC load 420. The voltage sensed at the first POR 410 is external to the EPGS 400 and thus can have external signal processing 430 on the voltage prior to be fed back to the EPGS 400. This voltage can be referred to as the external POR voltage (VPORe). As mentioned above, the signal processing 430 can be customer specific and may not meet the requirements for high performance due to latency and other considerations. The voltage sensed at the second POR 412 is internal to the EPGS 400 and can be referred to as the internal POR voltage (VPORi). The external POR voltage can be fed back into the EPGS 400 where it is compared at comparator 414 with either a reference voltage (VDC) or the internal POR voltage (VPORi). The difference in the voltage (voltage droop) between the external POR voltage and the reference voltage or internal POR voltage is then fed through the state filter and saturation 450 logic and hardware. The state filter and saturation 450 logic and hardware can saturate the difference (delta) voltage by setting a limit on the voltage supplied to the second comparator 416. This limit on the voltage can account for events such as a short circuit so that the comparator 416 does not bias the voltage too high. The second comparator biases the voltage based on the voltage droop (delta V) to account for voltage droop from the external POR voltage. Once biased, the voltage signal is fed into a third comparator 417 which receives an inner loop voltage taken from the internal POR 412 and fed through the AC feedback processing 440 logic and hardware. This comparator 417 provides the feedback voltage to the generator controller 402 to regulate the generator 404. The state filter and saturation 450 logic and hardware also sets the bandwidth for this outer loop feedback so that it is slower than the inner loop feedback. In addition, the voltage droop (delta V) can be sent to a protection health management system 460 that can be utilized to collect data on the overall system. In one or more embodiments, the generator controller 402 can enact an action based on the voltage droop exceeding a threshold. This action can be to open the GLC 424 to separate the EPGS 400 from the load 420.

In one or more embodiments, the internal point of regulation 412 and the external point of regulation 410 voltages can be sensed by any voltage sensing device. In addition, the current at these PORs 410, 412 can be sensed by any current sensing device. The sampling rate of the voltages and/or currents can be set by the generator controller 402 or by any other means.

In one or more embodiments, the generator controllers 202, 302, and 402 or any of the hardware referenced in the systems 200, 300, and 400 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
    a direct current (DC) power supply comprising a generator and a rectifier circuit connected to a load;
    a first voltage sensing device coupled to a first point of regulation;
    a second voltage sensing device coupled to a second point of regulation;
    a generator controller configured to:
        receive a first voltage signal from the first voltage sensing device;
        receive a second voltage signal from the second voltage sensing device;
        determine an adjustment for the generator, the adjustment comprising a transient performance response and a voltage droop response, wherein the transient performance response is determined based on the first voltage signal, and wherein the voltage droop response is determined based on the second voltage signal; and
        operate the generator based on the adjustment for the generator.

2. The system of claim 1, wherein determining the voltage droop response comprises comparing the second voltage signal to a reference voltage to determine a voltage droop on the load.

3. The system of claim 1, wherein determining the voltage droop response comprises comparing the second voltage signal to the first voltage signal to determine a voltage droop on the load.

4. The system of claim 1, wherein the first point of regulation is located at an output of the rectifier.

5. The system of the claim 1, wherein the second point of regulation is located at an input to the load.

6. The system of claim 1, further comprising a generator line contactor coupled between the rectifier circuit and the second voltage sensing device.

7. The system of claim 6, wherein the controller is further configured to:
- compare the second voltage signal to a reference voltage to determine a voltage difference;
- compare the voltage difference to a threshold voltage difference; and
- enact an action based on the voltage difference exceeding the threshold voltage difference.

8. The system of claim 7, wherein the action comprises generating an alert.

9. The system of claim 7, wherein the action comprises opening the generator line contactor.

10. The system of claim 1, further comprising a state and saturation filter, wherein the state and saturation filter limits the bandwidth of the second voltage signal.

11. The system of claim 1, further comprising a prognosis and health monitoring (PHM) system for an aircraft.

12. A system comprising:
- an alternating current (AC) power supply comprising a generator, wherein the generator is connected to a load;
- a first voltage sensing device coupled to a first point of regulation;
- a second voltage sensing device coupled to a second point of regulation;
- a generator controller configured to:
  - receive a first voltage signal from the first voltage sensing device;
  - receive a second voltage signal from the second voltage sensing device;
  - determine an adjustment for the generator, the adjustment comprising a transient performance response and a voltage droop response, wherein the transient performance response is determined based on the first voltage signal, and wherein the voltage droop response is determined based on the second voltage signal; and
  - operate the generator based on the adjustment for the generator.

13. The system of claim 12, wherein determining the voltage droop response comprises comparing the second voltage signal to a reference voltage to determine a voltage droop on the load.

14. The system of claim 12, wherein determining the voltage droop response comprises comparing the second voltage signal to the first voltage signal to determine a voltage droop on the load.

15. The system of claim 12, wherein the first point of regulation is located at an output of the generator.

16. The system of the claim 12, wherein the second point of regulation is located at an input to the load.

17. The system of claim 12, further comprising a generator line contactor coupled between the first voltage sensing device and the second voltage sensing device.

18. The system of claim 17, wherein the controller is further configured to:
- compare the second voltage signal to a reference voltage to determine a voltage difference;
- compare the voltage difference to a threshold voltage difference; and
- enact an action based on the voltage difference exceeding the threshold voltage difference.

19. The system of claim 18, wherein the action comprises generating an alert.

20. The system of claim 18, wherein the action comprises opening the generator line contactor.

* * * * *